(12) United States Patent
Braganca et al.

(10) Patent No.: US 9,130,055 B1
(45) Date of Patent: Sep. 8, 2015

(54) MAGNETIC RECORDING HEAD WITH CPP-GMR SPIN-VALVE SENSOR AND EXTENDED PINNED LAYER

(71) Applicant: HGST Netherlands B.V., Amsterdam (NL)

(72) Inventors: Patrick M. Braganca, San Jose, CA (US); Matthew J. Carey, San Jose, CA (US); Jeffrey R. Childress, San Jose, CA (US); Young-suk Choi, Los Gatos, CA (US); Jordan A. Katine, Mountain View, CA (US); Yang Li, San Jose, CA (US); John C. Read, San Jose, CA (US); Neil L. Robertson, Palo Alto, CA (US)

(73) Assignee: HGST Netherlands B.V., Amsterdam (NL)

(*) Notice: Subject to any disclaimer, the term of this patent is extended or adjusted under 35 U.S.C. 154(b) by 0 days.

(21) Appl. No.: 14/272,381

(22) Filed: May 7, 2014

(51) Int. Cl.
*H01L 21/02* (2006.01)
*H01L 29/82* (2006.01)
*H01L 43/02* (2006.01)
*G11C 11/16* (2006.01)
*G11B 5/39* (2006.01)

(52) U.S. Cl.
CPC ............. *H01L 29/82* (2013.01); *H01L 43/02* (2013.01); *G11B 5/39* (2013.01); *G11C 11/16* (2013.01); *G11C 11/161* (2013.01)

(58) Field of Classification Search
CPC ........ H01L 29/82; H01L 43/02; G11C 11/16; G11C 11/161; G11B 5/39
USPC ............ 257/295, 427; 365/158; 360/313, 326
See application file for complete search history.

(56) References Cited

U.S. PATENT DOCUMENTS

| | | | |
|---|---|---|---|
| 7,035,059 B2 | 4/2006 | Gill | |
| 7,123,455 B2 * | 10/2006 | Jayasekara | ................ 360/324.2 |
| 7,218,486 B2 | 5/2007 | Gill | |
| 7,245,463 B2 | 7/2007 | Gill | |
| 7,346,977 B2 | 3/2008 | Cyrille et al. | |
| 7,350,284 B2 | 4/2008 | Pinarbasi | |
| 7,365,949 B2 | 4/2008 | Hayakawa et al. | |
| 7,369,371 B2 | 5/2008 | Freitag et al. | |
| 7,502,211 B2 | 3/2009 | Gill | |
| 7,522,391 B2 | 4/2009 | Freitag et al. | |
| 7,580,230 B2 | 8/2009 | Freitag et al. | |
| 7,602,589 B2 | 10/2009 | Freitag et al. | |
| 7,810,227 B2 | 10/2010 | Kao et al. | |
| 7,978,441 B2 | 7/2011 | Lin et al. | |
| 8,045,299 B2 | 10/2011 | Fontana, Jr. et al. | |
| 8,068,317 B2 | 11/2011 | Gill | |
| 8,194,366 B1 | 6/2012 | Li et al. | |
| 8,266,785 B2 | 9/2012 | Freitag et al. | |
| 2003/0231437 A1 | 12/2003 | Childress et al. | |

* cited by examiner

*Primary Examiner* — Tu-Tu Ho
(74) *Attorney, Agent, or Firm* — Zilka-Kotab, PC

(57) ABSTRACT

In one embodiment, a device includes a reference layer, a free layer positioned above the reference layer, and a spacer layer positioned between the reference layer and the free layer, the spacer layer providing a gap between the reference layer and the free layer, wherein the reference layer extends beyond a rear extent of the free layer in an element height direction perpendicular to a media-facing surface of the device, and wherein a rear portion of the spacer layer that extends beyond the rear extent of the free layer has an increased resistivity in comparison with a resistivity of a rest of the spacer layer. In other embodiments, a method for forming the device is presented, along with other device structures having an extended pinned layer (EPL).

20 Claims, 15 Drawing Sheets

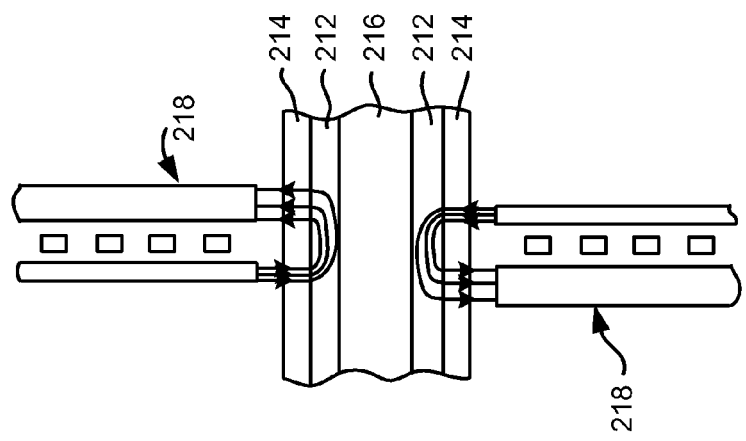
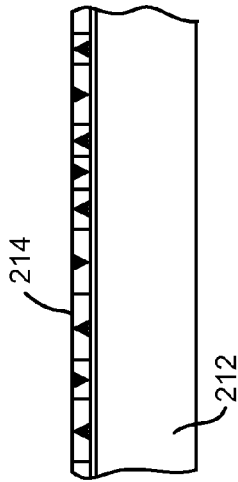
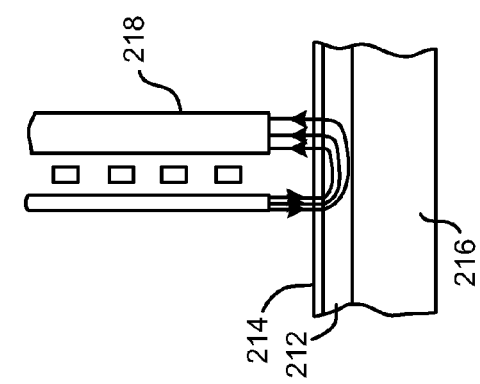
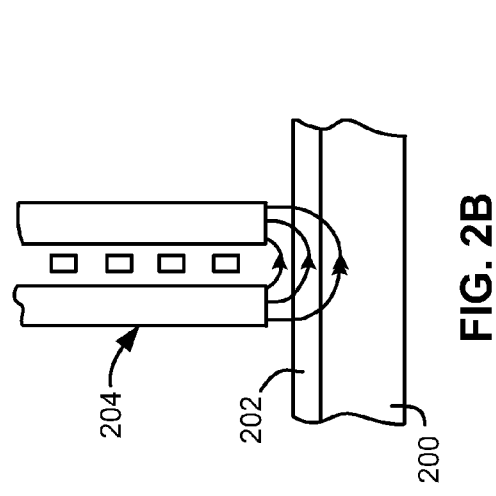

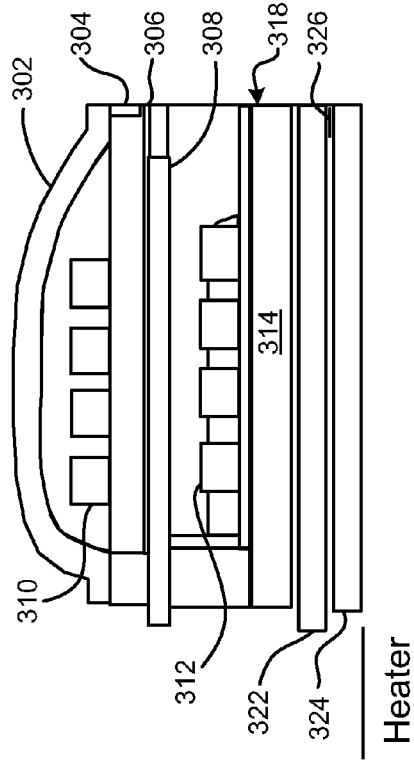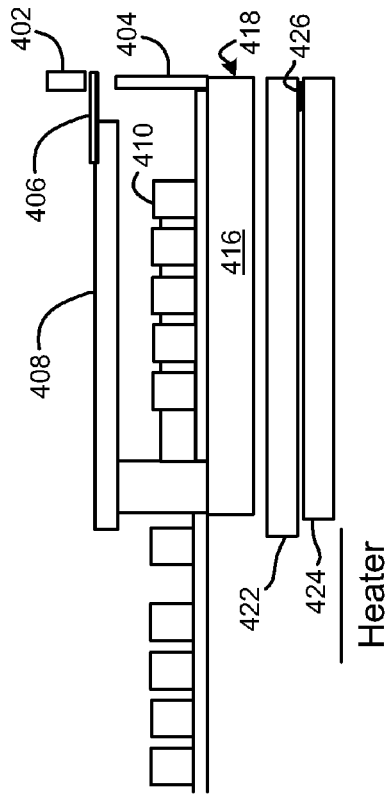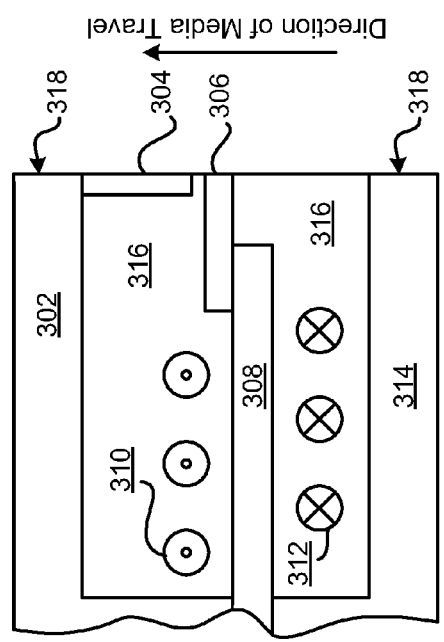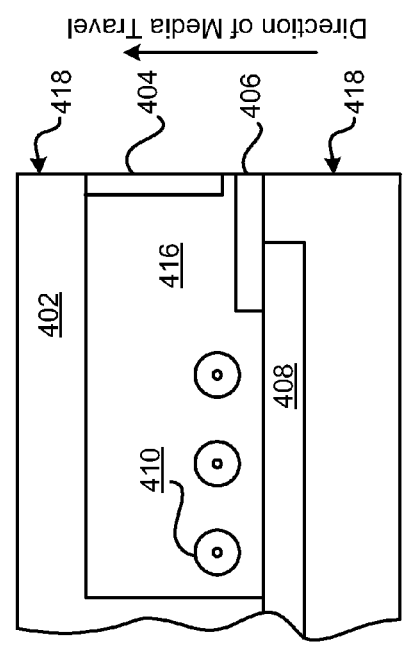

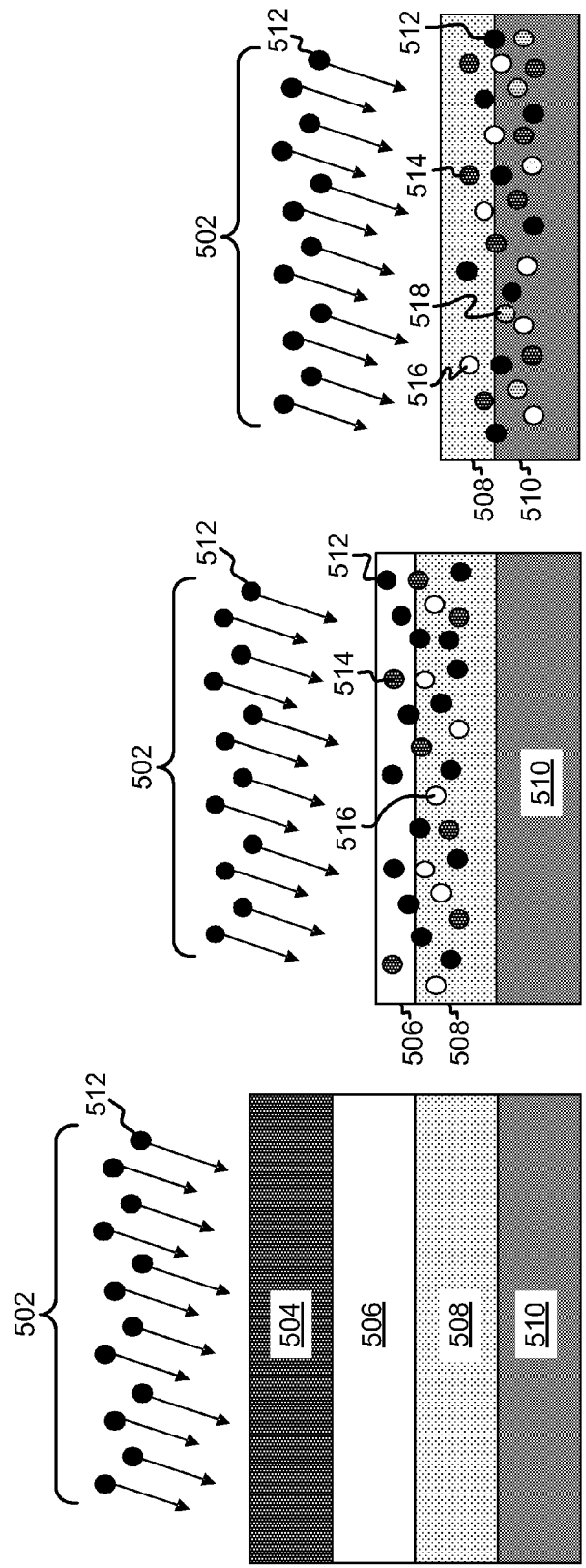

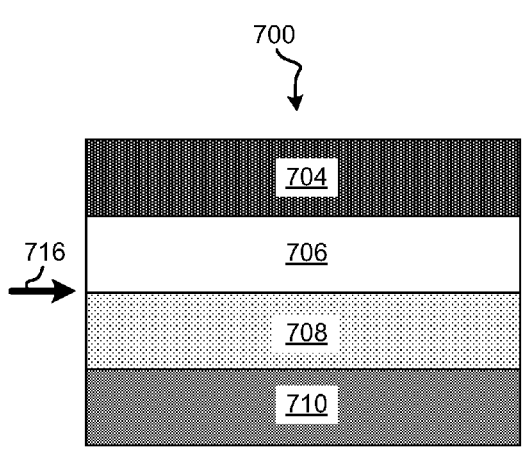
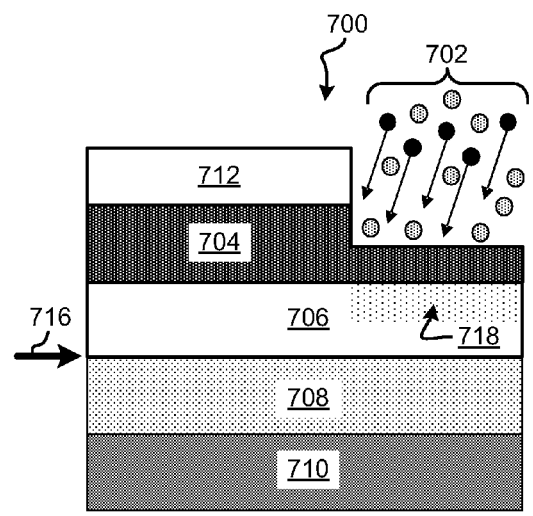
FIG. 7A    FIG. 7B
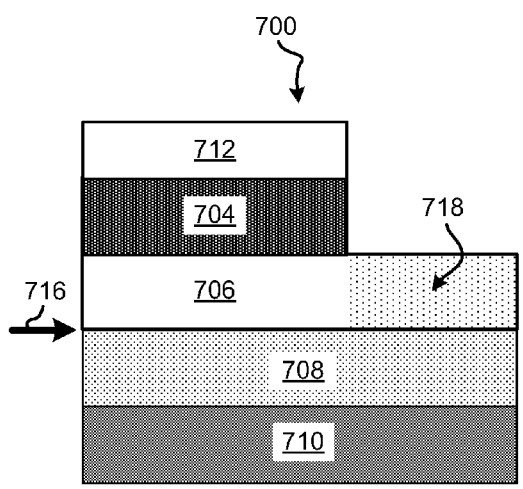
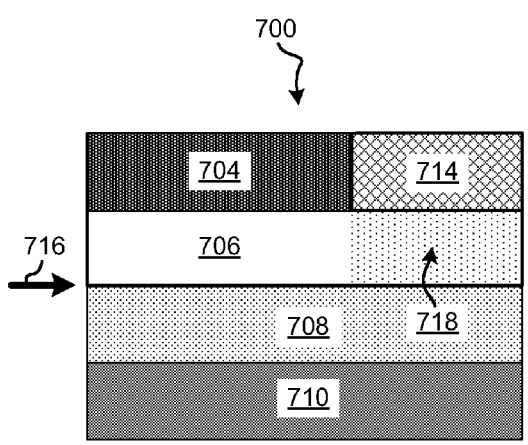
FIG. 7C    FIG. 7D

MAGNETIC RECORDING HEAD WITH CPP-GMR SPIN-VALVE SENSOR AND EXTENDED PINNED LAYER

FIELD OF THE INVENTION

The present invention relates to magnetic recording heads, and more particularly, this invention relates to a magnetic recording head having a Current-Perpendicular-to-Plane (CPP)-Giant Magnetoresistive (GMR) spin-valve sensor and an extended pinned layer.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, HDDs have been desired to store more information in its limited area and volume. A technical approach to this desire is to increase the capacity by increasing the recording density of the HDD. To achieve higher recording density, further miniaturization of recording bits is effective, which in turn typically requires the design of smaller and smaller components while maintaining the required signal-to-noise ratio (SNR) for magnetic recording and readback. One approach to achieve this reduction in component size while maintaining SNR is to use a CPP-GMR read sensor.

CPP-GMR read sensors achieve large magnetoresistive (MR) amplitude, narrow shield-shield spacing, and high magnetic stability. One technology which can be use to improve the magnetic stability of the reference and/or pinned layer of the spin-valve is to leave the pinned or reference layer to extend beyond the stripe-height dimension of the free layer during the wafer-level sensor fabrication. This geometry is usually referred to as extended pinned layer (EPL) or shape-enhanced pinning (SEP) technology.

One issue with this approach for CPP-GMR is that the layer above the reference or pinned layer (e.g., the spacer layer) is conductive. Therefore, in order to avoid electrical shunting of the signal (and low MR) in this region is to fully mill away the spacer layer. This approach, however, subjects the reference or pinned layer to excessive ion-mill damage. Therefore, it would be beneficial to fabricate an EPL sensor without shunting, while keeping a majority of the spacer layer intact above the reference layer in order to protect the magnetic properties of the reference or pinned layer.

Furthermore, EPL's are a pathway to improved read head sensor stability. The fabrication of such a pinned layer typically involves ion milling to define a free layer at the top of the film stack while leaving the lower pinned layer film longer in the direction of the sensor stripe height. One major challenge in fabricating a sensor according to this design is specific to the all metal stack used in CPP-GMR sensors. The fast milling rates of typical spacer materials and the subsequent potential for modification of the magnetic properties of the pinned layer due to ion milling is greatly enhanced by the all metal stack. Therefore, it would be beneficial to also be able to mill the all metal stack without the issues produced by the fast milling rates of the materials used.

SUMMARY

In one embodiment, a device includes a reference layer, a free layer positioned above the reference layer, and a spacer layer positioned between the reference layer and the free layer, the spacer layer providing a gap between the reference layer and the free layer, wherein the reference layer extends beyond a rear extent of the free layer in an element height direction perpendicular to a media-facing surface of the device, and wherein a rear portion of the spacer layer that extends beyond the rear extent of the free layer has an increased resistivity in comparison with a resistivity of a rest of the spacer layer.

In another embodiment, a method for forming a device includes forming a reference layer, forming a spacer layer above the reference layer, forming a free layer above the spacer layer, removing a rear portion of the free layer such that the reference layer and the spacer layer both extend beyond a rear extent of the free layer in an element height direction perpendicular to a media-facing surface of the device, wherein a rear portion of the spacer layer that extends beyond the rear extent of the free layer has an increased resistivity in comparison with a resistivity of a rest of the spacer layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

FIGS. 5A-5C show an ion milling process according to one example where damage is caused to underlying layers.

FIGS. 7A-7D show a series of steps in a formation process for a sensor stack according to one embodiment.

DETAILED DESCRIPTION

Figure 1:
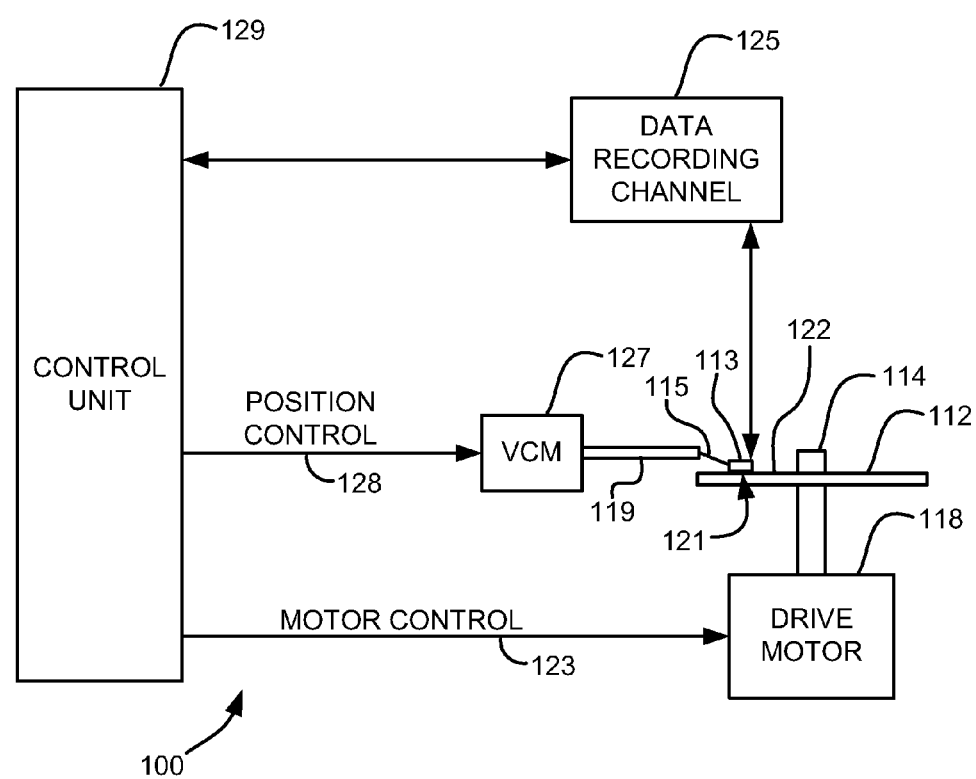
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

Unless otherwise specified herein, the various embodiments may be constructed using conventional materials for each layer, via conventional processes, as would be appreciated by one skilled in the art upon reading the present disclosure.

Typically, Current-Perpendicular-To-Plane (CPP)-Giant Magnetoresistive (GMR) sensors that have a pinned layer that is longer in a stripe height direction that points away from the media-facing surface (e.g., air bearing surface) of the apparatus have improved magnetostatics when compared to an apparatus that lacks the extended pinned layer (EPL). However, typically the entire stack comprises metal, including a spacer layer which is metal and has low resistivity. Therefore, conventional EPL processes rely on Ar ion milling to remove a majority of the metal spacer material, which causes milling damage in the pinned layer and creates a shunting path that may decrease sensor magnetoresistance.

In one general embodiment, a device includes a reference layer, a free layer positioned above the reference layer, and a spacer layer positioned between the reference layer and the free layer, the spacer layer providing a gap between the reference layer and the free layer, wherein the reference layer extends beyond a rear extent of the free layer in an element height direction perpendicular to a media-facing surface of the device, and wherein a rear portion of the spacer layer that extends beyond the rear extent of the free layer has an increased resistivity in comparison with a resistivity of a rest of the spacer layer.

In another general embodiment, a method for forming a device includes forming a reference layer, forming a spacer layer above the reference layer, forming a free layer above the spacer layer, removing a rear portion of the free layer such that the reference layer and the spacer layer both extend beyond a rear extent of the free layer in an element height direction perpendicular to a media-facing surface of the device, wherein a rear portion of the spacer layer that extends beyond the rear extent of the free layer has an increased resistivity in comparison with a resistivity of a rest of the spacer layer.

Referring now to FIG. 1, there is shown a disk drive 100 in accordance with one embodiment of the present invention. As shown in FIG. 1, at least one rotatable magnetic disk 112 is supported on a spindle 114 and rotated by a drive mechanism, which may include a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

As shown in FIGS. 5A-5C according to one example, damage and/or deposition of unwanted material may be caused to materials in layers which are positioned below a layer which is to be removed via ion milling.

As shown in FIG. 5A, in this exemplary stack 500, ion milling 502 is performed on a stack 500 comprising a free layer 504, a spacer layer 506, a reference layer 508, and an antiferromagnetic (AFM) layer 510. Ion milling relies on a plurality of material ions 512 which are impacted with a material to be removed. However, this material 512 may become deposited in one or more layers below the layer to be removed, and may even be deposited in a substrate below all the layers, depending on the amount of milling that is to be performed.

As shown in FIG. 5B, as a result of the ion milling 502, the free layer has been removed along with a portion of the spacer layer 506. In this process, the vast majority of the milling ions eventually escape in the vacuum system, and a vast majority of the milled layers are redeposited on various surfaces in the vacuum chamber. However, also as a result of the ion milling 502, a small fraction of milling material 512 may be deposited in the spacer layer 506 and the reference layer 508, along with a small fraction of free layer material 514 being deposited in the spacer layer 506 and the reference layer 508, and a small fraction of spacer layer material 516 being deposited in the reference layer 508.

The longer the milling is performed, the deeper the ions 502 will be impacted and the more material will be removed, and the more material from upper layers will be pushed down into lower layers, via individual etching rates for each material in the various layers.

As the ion milling 502 is continued to be carried out, as shown in FIG. 5C, the spacer layer has been removed along with a portion of the reference layer 508. However, also as a result of the ion milling 502, a small fraction of milling material 512 has been deposited in the reference layer 508 and the AFM layer 510, along with a small fraction of free layer material 514 being deposited in the reference layer 508 and the AFM layer 510, a small fraction of spacer layer material 516 being deposited in the reference layer 508 and the AFM layer 510, and a small fraction of reference layer material 518 being deposited in the AFM layer 510.

This effect of ion milling may cause conductive material to be deposited in layers which are intended to act as insulation, insulating material to be deposited in a conductive layer, thereby reducing the conductivity of the layer, at least locally near an upper surface thereof, and/or deposition of material in layers which are adversely affected by the presence of such a material. Furthermore, other unwanted characteristics may be imparted on a lower layer due to material being deposited therein due to the ion milling process. Although a stop layer may be utilized to prevent this sort of transfer, it is not always feasible or desired to have a stop layer in a stack of materials, particularly those that are used in micromagnetic applications, such as read sensors, write heads, etc.

It has been found that damage sustained during ion milling may be attributable to materials from upper layers being driven into lower layers, as well as the milling material becoming embedded within layers of the stack 500.

Figure 6A:
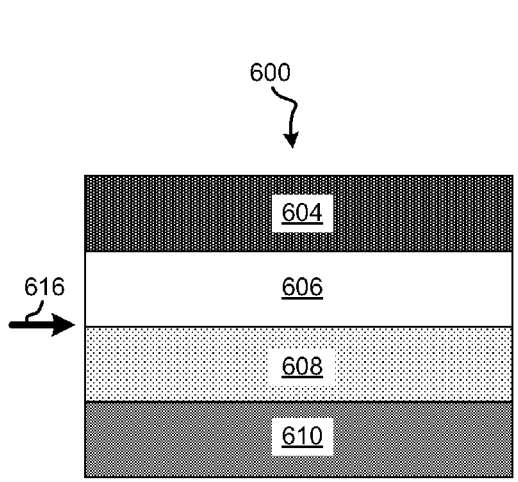
FIGS. 6A-6D show a series of steps in a formation process for a conventional sensor stack.
Figure 6B:
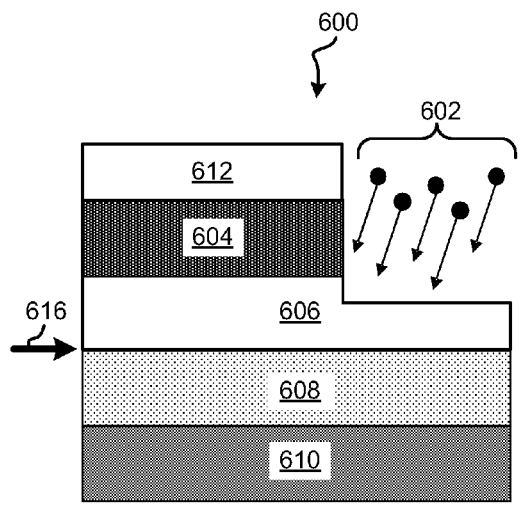
Figure 6C:
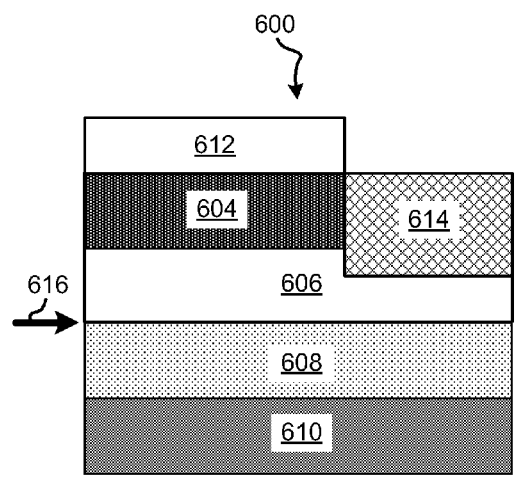
Figure 6D:
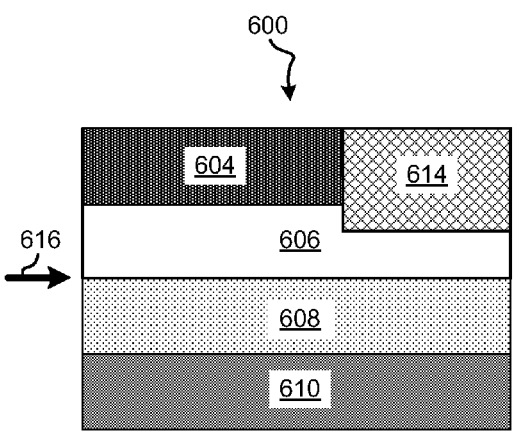

FIGS. 6A-6D show a contemporary extended pinned layer (EPL) process, according to the prior art. In FIG. 6A, a sensor stack 600 is shown prior to EPL processing which includes a free layer 604, a spacer layer 606, a reference (or pinned) layer 608, and an AFM layer 610. As shown in FIG. 6B, a mask layer 612 is formed above the free layer 604 to allow device patterning by ion milling. Then, ion milling 602 is performed on the sensor stack 600 in order to mill away a back portion of the free layer 604 away from the media-facing surface 616 and remove as much of the spacer layer 606 as possible without causing damage to the reference layer 608. In principle, it is desired to remove the entire spacer layer 606. However, this is not possible without causing damage to the reference layer 608, since it is difficult to control the rate of milling once the free layer 604 portion is removed. Therefore, some of the reference layer 608 may be damaged when trying to remove all of the spacer layer 606. Then, in the void area left behind due to the ion milling 602 as shown in FIG. 6C, an insulating refill material 614 is formed. Next, as shown in FIG. 6D, the mask layer 612 is removed, possibly through a planarization method or some other technique (which may also planarize the insulating refill material 614).

As FIGS. 6A-6D show, due to the ion milling 602 process, there is a risk that portions of the reference layer 608 may be damaged due to removal of the spacer layer 606 thereabove, along with the possibility of having material from the free layer 604 and/or ions used in the ion milling 602 deposited into the remaining spacer layer 606 and/or the reference layer 608 positioned therebelow. Furthermore, magnetic characteristics of the reference layer 608 may be altered due to the ion milling 602 process, resulting in reduced performance of the sensor stack 600.

The use of an extended (shape enhanced) pinned layer is known to improve read head sensor stability. Now referring to FIG. 6D, an extended pinned layer structure is shown. For an all metal CPP-GMR sensor thin film stack 600, the material used for the free layer 604 and the material used for the spacer layer 606 are typically defined with nanofabrication methods while leaving the reference/pinned layer 608 (and/or exchange biased layer) and the AFM layer 610 to have a shape which is longer in the stripe height direction than the free layer 604 and magnetically unaltered by this patterning process.

Figure 10A:
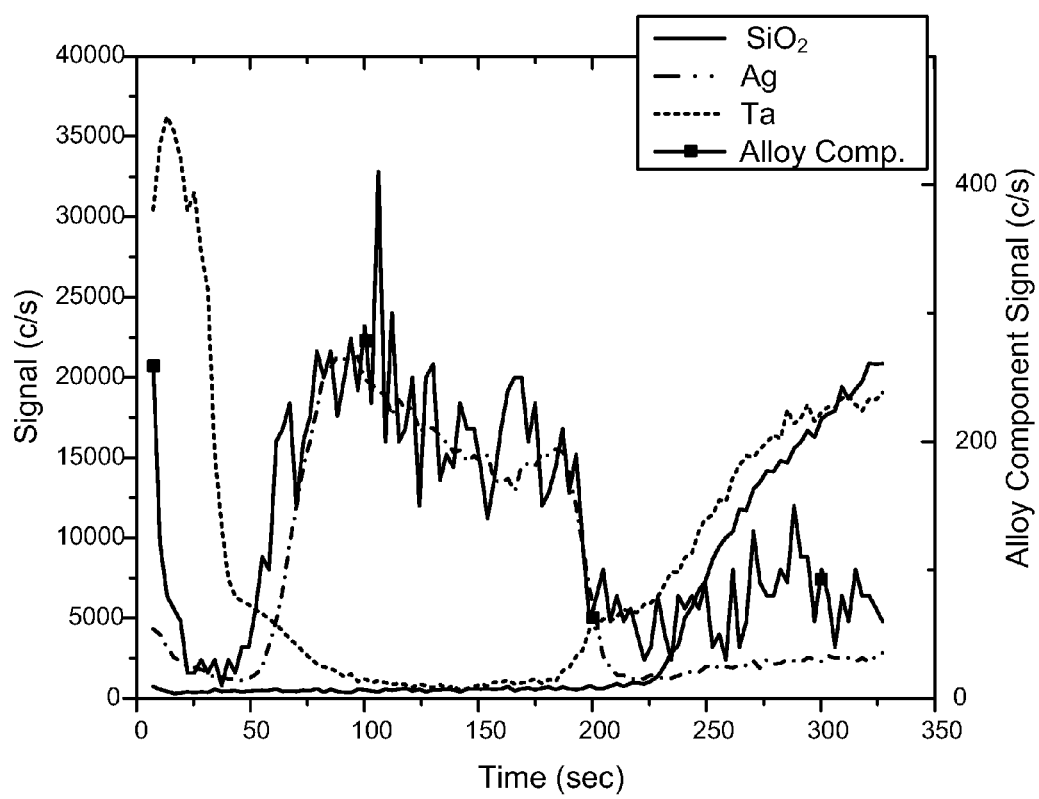
FIG. 10A shows the ion milling rate of a single 20 nm spacer layer comprising an AgSn alloy as measured by secondary ion mass spectrometry (SIMS).
Figure 10B:
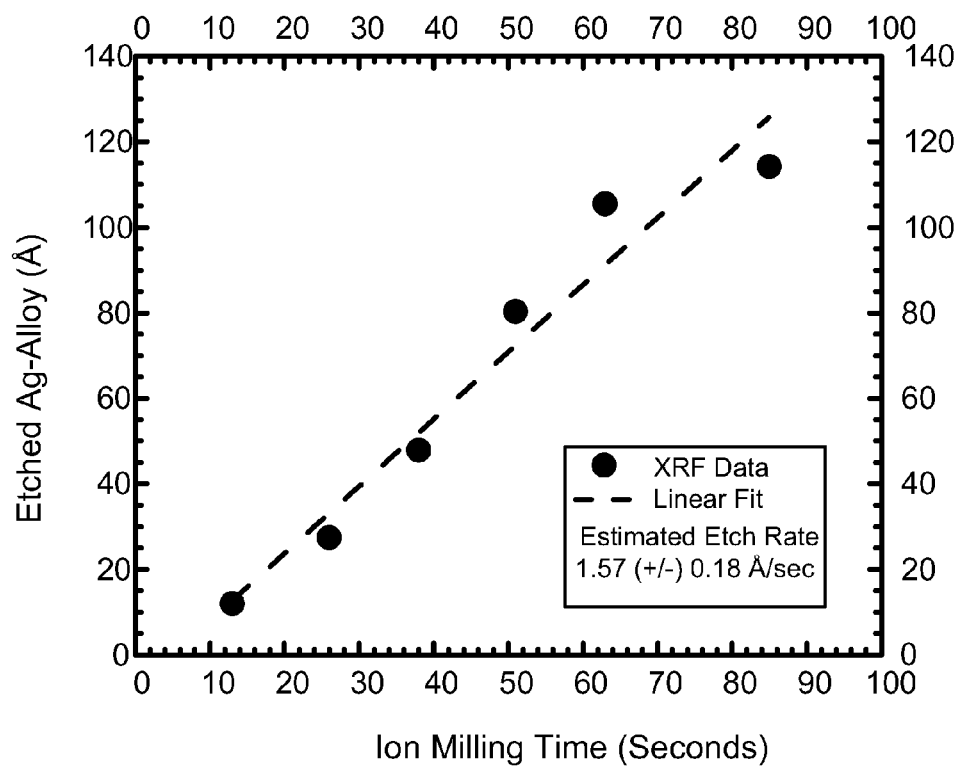
FIG. 10B shows several X-ray Fluorescence Spectrometry (XRF) measurements of the thickness of AgSn films that were ion milled for various times.
Figure 11:
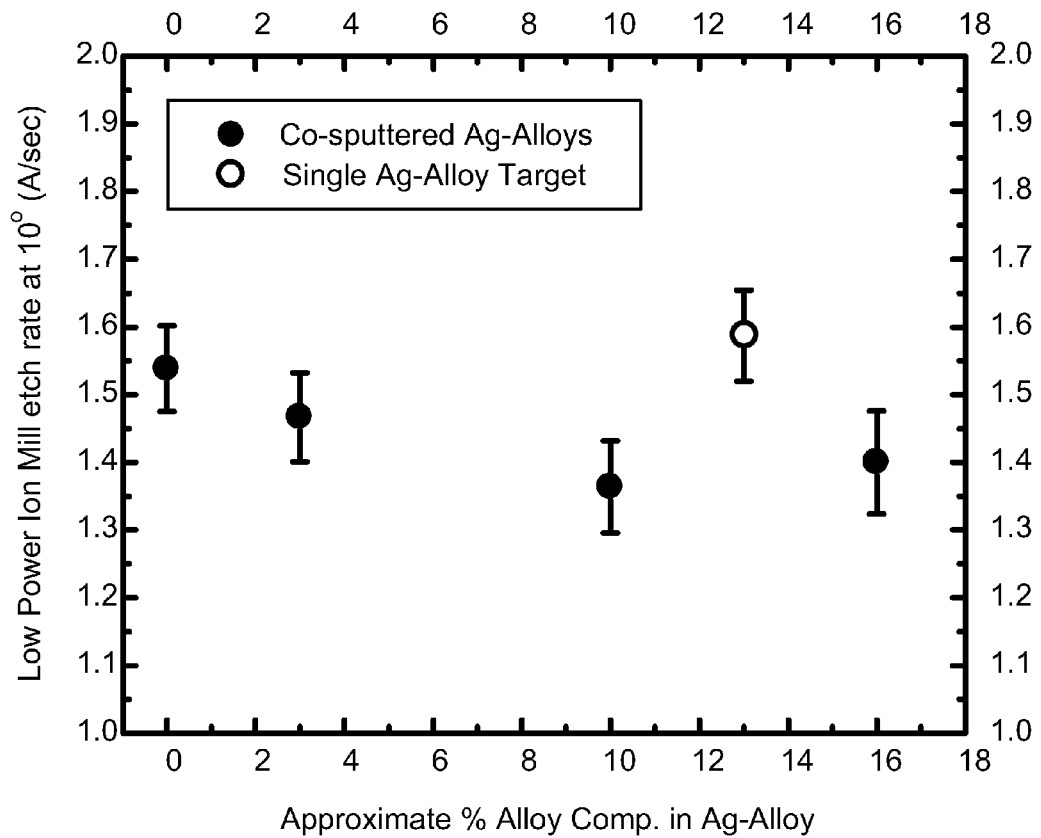
FIG. 11 shows results from ion milling rate measurements on Ag films and co-sputtered Ag—Sn films.

Typical spacer layer 606 dimensions are on the order of about 2 nm to about 5 nm in thickness. However, ideal spacer materials have very fast ion milling rates. As an example, the ion milling rate of a single 20 nm test film comprising an Ag-alloy as measured by secondary ion mass spectrometry (SIMS) is shown in FIG. 10A and several X-ray Fluorescence Spectrometry (XRF) measurements of the thickness of Ag-alloy films that were ion milled for various times are shown in FIG. 10B. These results are also consistent with previous ion milling rate measurements on Ag films and co-sputtered Ag-alloy films, as shown in FIG. 11.

It is known that an unwanted alteration of the magnetic properties of the ferromagnet occurs in a ferromagnet/metal bilayer structure when the metal layer is ion milled too close to the ferromagnet/metal interface. This alteration is generally attributed to the scattering cross section and the transfer of momentum from the gas ion used in the milling process to the metal atoms which drives these metal atoms into the ferromagnet below, thus altering its composition and magnetic properties. This knock-on effect is able to severely alter the magnetic performance of the ferromagnet.

Figure 12:
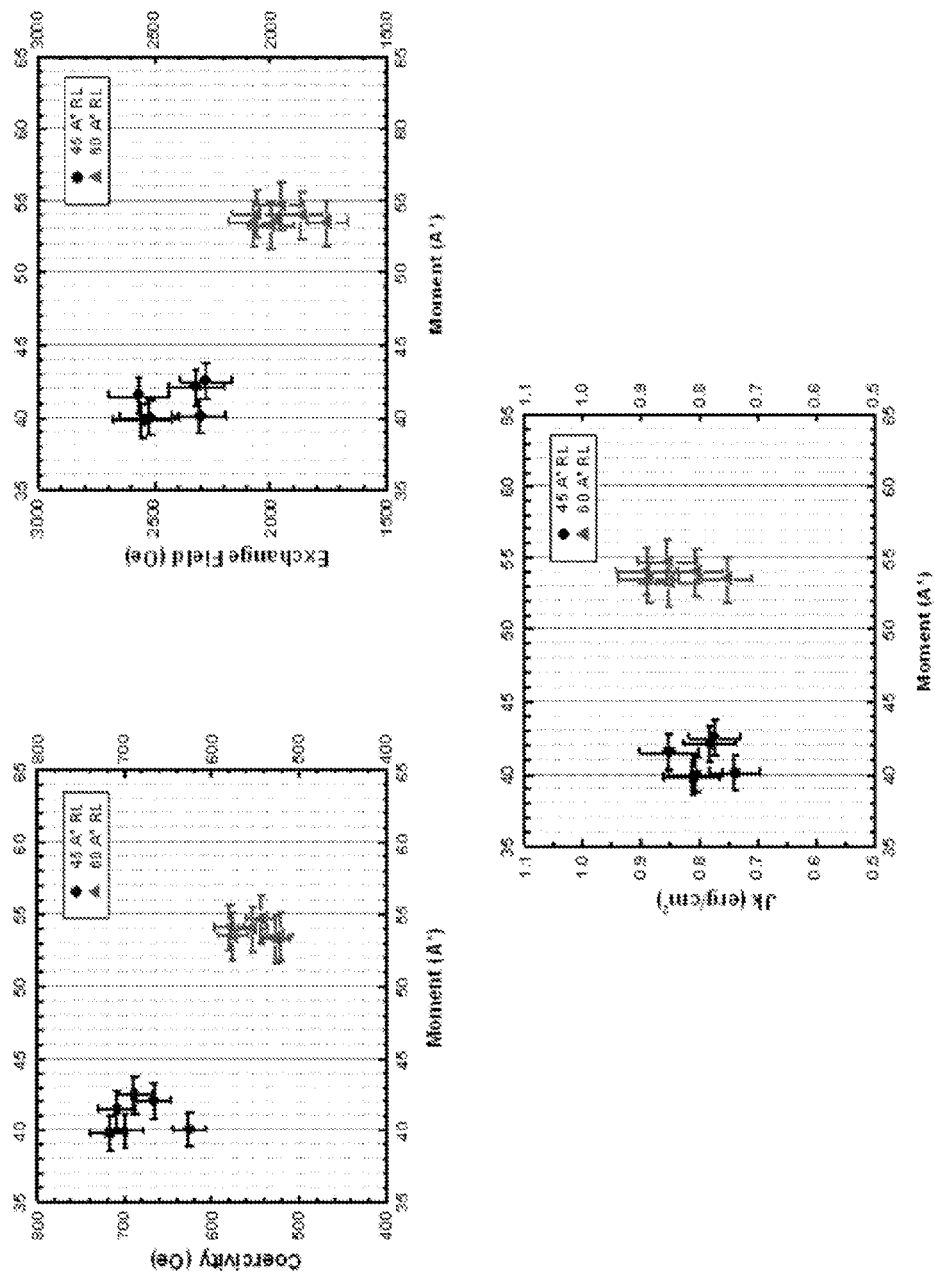
FIG. 12 shows magnetic properties of test structures as measured with Vibrating Sample Magnetometry (VSM).

In an extended pinned layer sensor design, as shown in FIG. 6D, it is clear that the knock-on effect could seriously alter the pinned layer in the region where the spacer layer is removed from above the pinned layer. As an example, data from ion milling of two thin film test structures is described below. One test structure had a magnetic moment that is equivalent to 4.5 nm of Ni81Fe19 and comprised 1 Ta/1.5 Ru/5.5 IrMn/1.3 CoFe/1.3 CoFeGe/12 Ag-alloy (in nm). The other test structure had a magnetic moment equivalent to 6.0 nm of Ni81Fe19 and comprised 1 Ta/1.5 Ru/5.5 IrMn/1.3 CoFe/2.5 CoFeGe/12 Ag-alloy (in nm). The magnetic properties of these test structures was measured with Vibrating Sample Magnetometry (VSM) are summarized in the three panels of FIG. 12. The test structures include exchange coupled layers which are characterized with the following metrics. The magnetic moment of the pinned layer is plotted in units of equivalent Ni81Fe magnetic film thickness (Ms (A*)). The pinned layer coercivity (Hc) and exchange field (Hex) are in units of Oersted. Furthermore, the strength of the exchange bias with Jk $[erg/cm^2]=Ms[A*]\times Hex[Oe]\times 8\times 10^{-6}$ $[(erg/cm^2)/(A*Oe)]$.

Figure 13:
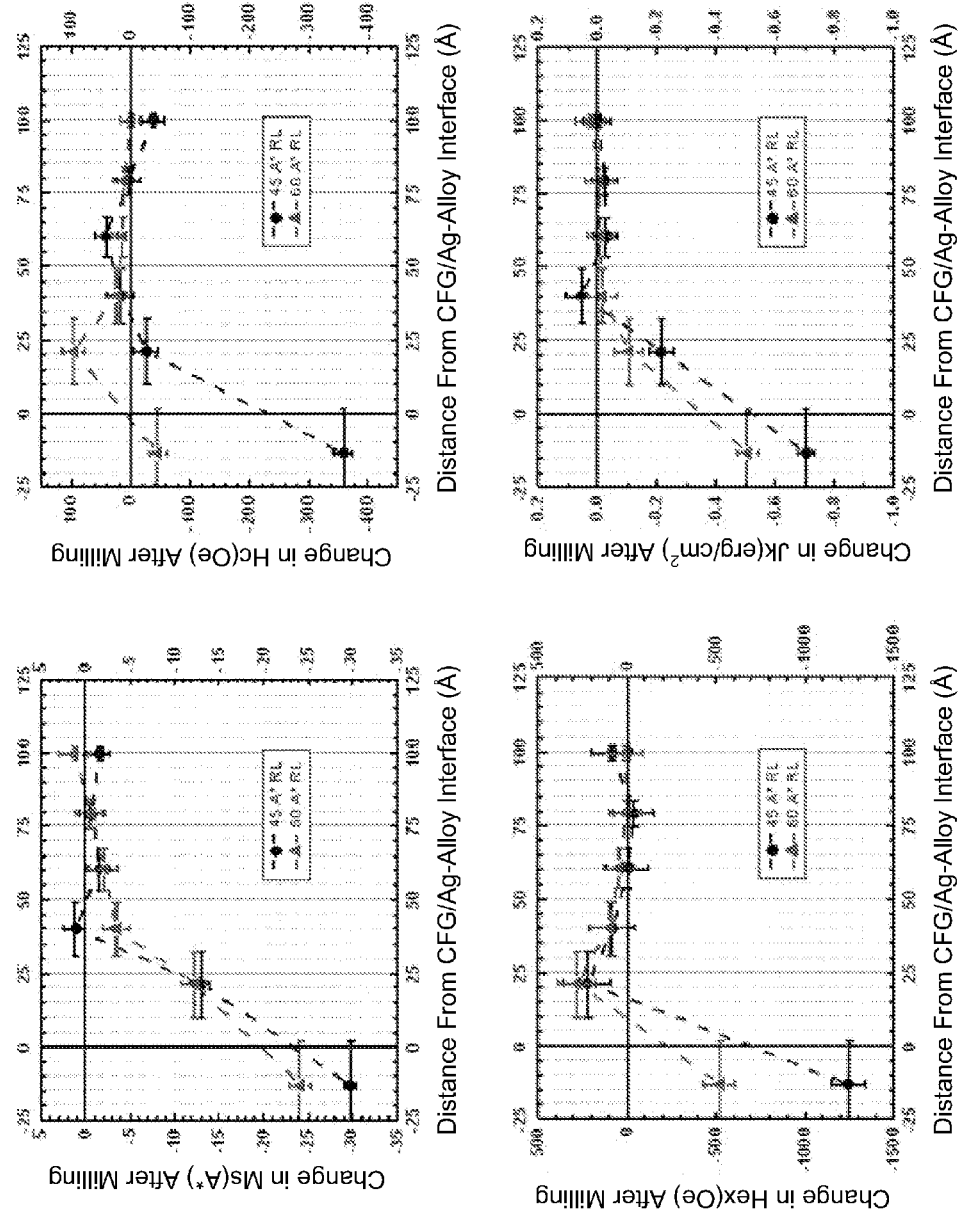
FIG. 13 show changes in the magnetic properties of these test structures after ion milling as measured by VSM.

These test structures were ion milled for various times based on the milling rate of a Ag-alloy as discussed above. The sample normal was set 10° from the direction of the accelerated Ar ions. The milling depth into the Ag-alloy film was confirmed using XRF (according to the data presented in FIG. 10B). The four panels of FIG. 13 show the resulting changes in the magnetic properties of these test structures after ion milling as measured by VSM. It is clear from these measurements that ion milling at 10° to a depth of about 4 nm from the CoFeGe/Ag-alloy surface begins to alter the magnetic properties of the CoFeGe, which is a ferromagnetic alloy material that yields good CPP GMR structures with Cu and/or Ag-based spacer layers without high deposition or processing temperatures. This modification becomes more pronounced as the Ag-alloy material is completely removed. The thickness range is significant because, as previously noted, it is the same as the range of film thicknesses that are typically used for spacer layer materials in CPP-GMR sensors.

A significant change in the magnetic properties of the test structures due to the knock-on effect as summarized in FIG. 13 clearly suggests that great care should be taken when defining an extended pinned layer in a CPP-GMR read head sensor. To alleviate the detrimental knock-on effect, a method to fabricate a CPP-GMR spin-valve read head with an extended pinned layer, which results in less damage to the reference layer and little or no shunting through the spacer layer, may be used. Several methods to form this extended pinned layer sensor structure may be used, as described in various embodiments.

In one embodiment, angle-dependent ion milling may be used. The knock-on effect is likely to have angular dependence since it is a momentum based effect. A combination of milling angles and milling times designed to minimize the component of the momentum in the direction perpendicular to the pinned layer/spacer layer interface (straight down in FIG. 6D) of the knocked on metal may reduce the modification of the magnetic properties of the pinned layer.

In another embodiment, ion milling may be performed using an alternative process gas. Given that the knock-on effect is momentum based, decreasing the momentum of the incoming ion may reduce the effect. According to some experiments, Ne has smaller momentum but greater penetration depth into most materials. Kr and Xe may also have larger momentum (due to more mass) but penetrate less deeply than Ne and often have slower ion milling rates. In some experiments, Xe may perform better, but any of Ne, Kr, and Xe may be used, as they are all function acceptably. Accordingly, Ne may be used as the milling gas since it has a smaller mass and will have smaller momentum and will thus generate a smaller knock-on effect.

In yet another embodiment, mixed gas may be used in reactive ion milling to oxidize the spacer layer and slow the milling rate. Typical spacer materials like Ag and Cu (and alloys of Ag—X and Cu—X, where X is Al, Si, Ge, Ga, In, Sn, etc.) have a fast ion milling rate. This means the knock-on effect is significant when these materials are used and also suggests that the process window for milling the spacer layer is very small. It is well known that Ag and Cu may be oxidized during reactive sputtering in a mixed Ar—O sputter gas. Such a gas mixture may be used during ion milling to slow the milling rate of the spacer film region during SEP definition and potentially minimize the knock-on effect on the pinned layer.

Now referring to FIGS. 7A-7D, an EPL process is shown according to one embodiment. In FIG. 7A, a stack 700 is shown prior to EPL processing which includes a free layer 704, a spacer layer 706, a reference (or pinned) layer 708, and an AFM layer 710. These layers may comprise any suitable materials and may have any arrangement, design, and/or orientation as would be known to one of skill in the art. For example, the reference layer 708 may be a single pinned layer or a multi-layer coupled reference/pinned layer system comprising two or more layers. As shown in FIG. 7B, a mask layer 712 may be formed above a portion of the free layer 704 to facilitate ion milling 702 (or some other form of facilitating ion milling 702 may be used as would be known by one of skill in the art). Then, ion milling 702 is performed on the stack 700 in order to mill away a back portion of the free layer 704 away from the media-facing surface 716 and maintain the spacer layer 706 without removing a substantial portion thereof.

In one embodiment, the ion milling 702 may be performed in an environment having oxygen present, along with the ions used in the ion milling 702. Because the ion milling 702 is performed in an environment having a reactive gas therein (such as oxygen, nitrogen, etc.), as the back portion of the free layer 704 is milled away, the back portion of the spacer layer 706 beneath the back portion of the free layer 704 that is removed may react with the reactive gas which is deposited into the back portion of the spacer layer 706, thereby forming a reacted portion 718 of the spacer layer 706. When the reactive gas is oxygen, the reacted portion 718 may be oxidized, when the reactive gas is nitrogen, the reacted portion 718 may be nitrogenated, etc.

This reacted portion 718 may have a substantially increased resistivity as compared to the rest (untreated portion) of the spacer layer 706. Therefore, it is easier to maintain substantially all of the spacer layer 706 after the ion milling 702 is completed as compared to ion milling an untreated spacer layer 706.

As shown in FIG. 7B, while ion milling 702 is removing the back portion of the free layer 704, the spacer layer 706 thereunder is already beginning to react with the reactive gas to form the reacted portion 718. Then, as shown in FIG. 7C, after the back portion of the spacer layer 706 is completely removed, most or all of the back portion of the spacer layer 706 may have reacted with the reactive gas as it is driven into the back portion of the spacer layer 706 to form the reacted portion 718 which may encompass an entire depth of the spacer layer 706 in the film deposition direction (perpendicular to the arrow indicating the media-facing surface 716), in one embodiment. In another embodiment, the reacted portion 718 may encompass more than about 90%, 75%, 60%, 50%, 25%, etc. of the film thickness depth of the spacer layer 706 that is exposed at the back end of the spacer layer 706.

Then, in the void area left behind due to the ion milling 702 as shown in FIG. 7D, an insulating refill material 714 is formed. Thereafter, the mask layer 712 is removed (possibly via planarization or some other method which may also planarize the upper surface of the refill material 714). This results in a reacted portion 718 which is harder to etch or ion mill than the spacer layer 706, and therefore more protection is afforded to the reference layer 708 during subsequent milling or etching processes.

Figure 8A:
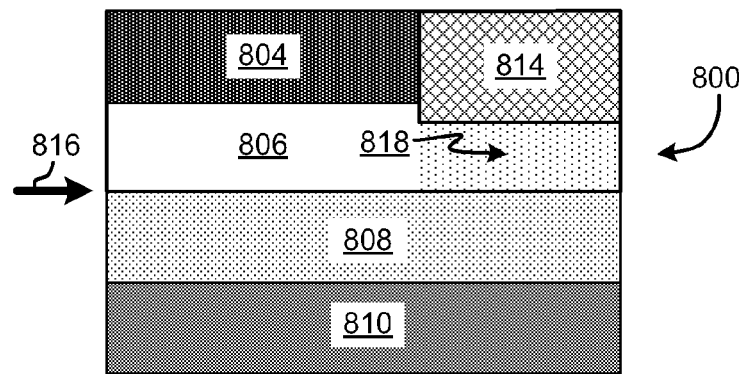
FIGS. 8A-8C show sensor stacks according to various embodiments.
Figure 8B:
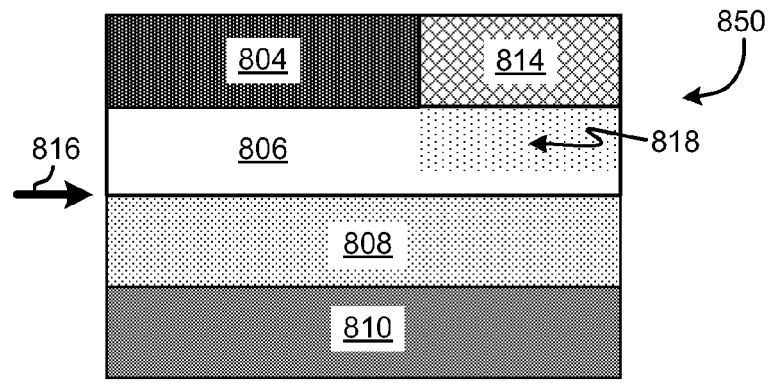
Figure 8C:
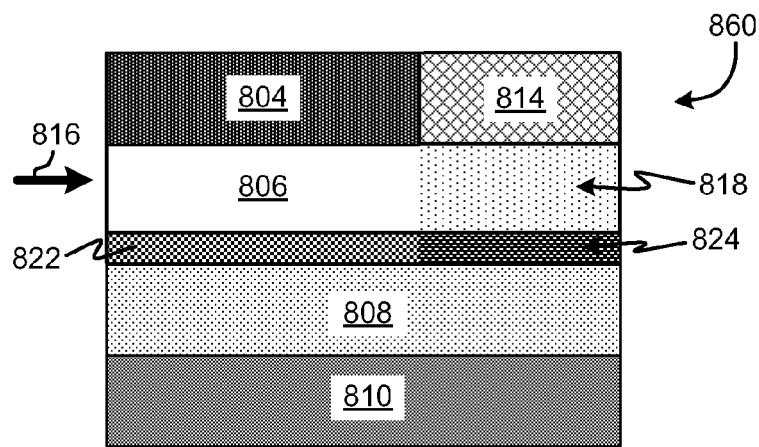

With reference to FIGS. 8A-8C, three additional embodiments are shown. Each of these embodiments may be used in combination with any other embodiments described herein, or independently to provide more protection during formation of the sensor stack.

In FIG. 8A, a sensor stack 800 is shown having an arrangement in one embodiment where a portion of the upper surface of the reacted portion 818 of the spacer layer 806 has been ion milled and/or removed, thereby resulting in the refill material 814 having a deposition thickness greater than that of the free layer 804. However, neither the reference (or pinned) layer 808 nor the AFM layer 810 are negatively affected during the ion milling process due to the increased resistivity of the reacted spacer layer portion 818 as compared to the rest (untreated portion) of the spacer layer 806. Any method of increasing the resistivity of the spacer layer 806 may be used as described herein or as known in the art.

In the sensor stack 800 shown in FIG. 8A, the electrical resistivity of the spacer layer 806 may be substantially altered by exposure to a reactive gas after the ion mill process to form the reacted spacer layer portion 818. This process leaves the majority of thickness of the spacer layer 806 intact, but substantially increases the resistivity of the remaining reacted spacer layer portion 818.

To form this sensor stack 800, in one embodiment, ion milling may be performed in an Ar gas environment until an upper surface of the spacer layer 806 is exposed, then a reactive gas (such as $O_2$, $N_2$, a mixture of $O_2$ and $N_2$, etc.) may be added to the Ar gas, and the reactive gas, during continued slow ion milling, will react with the reactive material in the spacer layer 806 to form a reacted spacer layer portion 818 having an insulating property via a natural reaction and/or a plasma reaction. The longer the surface of the spacer layer 806 is exposed to the reactive gas, the deeper the reacted spacer layer portion 818 is formed toward the reference layer 808. This potentially reduces the milling damage to the layers below the spacer layer 806, and adds an insulating layer above the read end of the reference layer 808 in a single step.

Another sensor stack 850 is shown in FIG. 8B according to another embodiment. In this sensor stack 850, the rear end of the spacer layer 806 is not milled away substantially; in addition, the reacted spacer layer portion 818 does not extend through the extent of the rear end of the spacer layer 806 in the deposition thickness direction all the way to the reference layer 808.

In the sensor stack 850 shown in FIG. 8B, the electrical resistivity of the spacer layer 806 may be substantially altered by exposure to a reactive gas after the ion mill process to form the reacted spacer layer portion 818. This process leaves the majority of thickness of the spacer layer 806 intact, but substantially increases the resistivity of the remaining reacted spacer layer portion 818.

To form this sensor stack 850, in one embodiment, ion milling may be performed in an Ar gas environment until an upper surface of the spacer layer 806 is exposed, then a reactive gas (such as $O_2$, $N_2$, a mixture of $O_2$ and $N_2$, etc.) may be added to the Ar gas or the Ar gas may be replaced with the reactive gas, and the reactive gas will react with the reactive material in the spacer layer 806 to form a reacted spacer layer portion 818 having an insulating property via a natural reaction and/or a plasma reaction. In this approach, milling damage is reduced by reducing the milling depth once the Ar is replaced with the reactive gas. The longer the surface of the spacer layer 806 is exposed to the reactive gas, the deeper the reacted spacer layer portion 818 is formed toward the reference layer 808.

Now referring to FIG. 8C, a sensor stack 860 is shown according to another embodiment. In this sensor stack 860, an insert layer 822 may be positioned above the reference layer 808, such as between the reference layer 808 and the free layer 804, and/or above the AFM layer 810, such as between the AFM layer 810 and the reference layer 808.

According to various embodiments, reactive milling, reactive gas exposure, or a combination of the two methods may be utilized to form a reacted insert layer portion 824, in conjunction with a reactive material being present in the insert layer 822. Furthermore, a reactive material (which may be the same or different from that in the insert layer 822) may be added to the spacer layer 806 to form the reacted spacer layer portion 818.

While in the absence of ion-milling and reactive gas/plasma, this reactive material does not cause the spacer layer 806 to degrade in performance substantially; however, when exposed to the reactive gas/plasma, this reactive material causes the exposed portion of the spacer layer 806 to transform into a high-resistivity layer and/or low-milling-rate layer in the reacted spacer layer portion 818. Similarly, this reactive material causes the portion of the insert layer 822 beneath the exposed portion of the spacer layer 806 to transform into a high-resistivity layer and/or low-milling-rate layer in the reacted insert layer portion 824.

To form the sensor stack 860 shown in FIG. 8C, ion milling may be performed in an Ar gas environment until an upper surface of the spacer layer 806 is exposed, then a reactive gas (such as $O_2$, $N_2$, a mixture of $O_2$ and $N_2$, etc.) may be added to the Ar gas, and ion milling may continue to be carried out at a slower milling rate, with the reactive gas reacting with the reactive material in the spacer layer 806 to form a reacted spacer layer portion 818 having an insulating property. Furthermore, when the insert layer 822 is present, the reactive gas may react with the reactive material in the insert layer 822 to form a reacted insert layer portion 824 having an insulating property.

In the embodiments described in FIGS. 8A-8C, any suitable reactive material known in the art may be used along with any suitable reactive gas and/or plasma. Some exemplary reactive materials include, but are not limited to, Mg (becoming MgO when exposed to oxygen), Al (becoming $Al_2O_3$ when exposed to oxygen and/or $O_2$, or AlN when exposed to nitrogen and/or $N_2$), Si (becoming $SiO_2$ when exposed to oxygen and/or $O_2$, or $Si_3N_4$ when exposed to nitrogen and/or $N_2$), Sn (becoming $SnO_2$ or SnO when exposed to oxygen and/or $O_2$), etc. This reactive material may be added to the spacer layer 806 in the form of impurities (alloying), impregnated therein, as thin nanolayers (having a thickness of about 0.1 nm to about 1 nm on average), or some other technique known in the art.

When nanolayers are used, a single nanolayer or multiple nanolayers may be present, possibly with alternating materials in each nanolayer, e.g., alternating nanolayers of reactive material separated by nanolayers or thicker layers of spacer layer material. The multiple nanolayers may be positioned above one another, either in direct contact or spread throughout some or all of the spacer layer 806.

FIGS. 8A-8C depict sensor stacks that may be included in a magnetic head, in accordance with various embodiments. As an option, the sensor stack may be implemented in conjunction with features from any other embodiment listed herein, such as those described with reference to the other Figures. Of course, however, such sensor stacks and others presented herein may be used in various applications and/or in permutations which may or may not be specifically described in the illustrative embodiments listed herein. Further, the sensor stacks and magnetic heads presented herein may be used in any desired environment.

In one embodiment, the spacer layer 806 may comprise elements whose electrical resistance may be substantially altered by exposure to one or more gases and/or plasma that are reactive to elements within the spacer layer 806. According to various embodiments, materials for a spacer layer 806 may include Cu, Ag, Au, and alloys thereof. For example, a spacer layer 806 may include an alloy of Ag with Si, Al, Ge, Ga, In, and/or Sn, etc. During the ion milling procedure, Ar+ ions (or some other suitable ion known in the art) may be used, and SIMS may be used to provide feedback about the depth of the milling procedure. When the milling depth approaches the upper surface of the spacer layer 806, a reactive gas (or plasma in some approaches) such as $O_2$, $N_2$, or some other suitable reactive gas or plasma known in the art, or combination of gases and/or plasmas, may be added to the ion milling gas or replace the ion milling gas entirely, which substantially modifies (increases) the resistivity of the material that comprises the spacer layer 806 due to a reaction between the reactive gas/plasma and element(s) within the spacer layer 806 to form the reacted spacer layer portion 818.

Due to the use of the reactive milling process (Ar+O, Ar+N, etc.) and/or the alternative process gas being used in the milling process (Xe, Ne, etc.), the ion milling rate of the spacer layer 806 may be reduced, allowing for better depth control of the ion milling process and less damage to the underlying layers (due to material deposition therein from upper layers, unwanted material removal, etc.), along with an increase in resistivity of the spacer layer 806 in the reacted spacer layer portion 818. This process leaves all or at least a substantial amount (greater than about 50%, 60%, 75%, 80%, 90%, 95%, etc., depending on the control exerted over the ion milling procedure) of the spacer layer 806 thickness intact, but substantially increases the resistivity of the remaining spacer layer 818.

In more embodiments, the reactive gas/plasma may be added in a subsequent operation after the ion-milling procedure is completed and/or in-between one or more ion milling procedures (incremental ion milling steps after which the reactive gas/plasma is added and SIMS may be verified to ensure milling is not progressing too far, e.g., into the reference/pinned layer). This process also leaves a substantial amount of the spacer layer 806 thickness intact (such as the entire thickness, more than 90% of the thickness, more than 75% of the thickness, more than 50% of the thickness, etc.) while substantially increasing the resistivity of the reacted spacer layer portion 818 which remains exposed.

In a third embodiment, a reactive material may be added to a typical spacer layer 806 material. While in the absence of ion-milling and reactive gas/plasma, this reactive material does not cause the spacer layer 806 to degrade substantially in performance. However, when exposed to the reactive gas/plasma, this reactive material transforms into a high-resistivity material and/or a lower-milling-rate material than the typical spacer layer 806 material.

In one embodiment, a device, such as a sensor stack 800, a magnetic head, a read element, etc., may include a reference layer 808, a free layer 804 positioned above the reference layer 808, the free layer 804 configured to respond to external magnetic fields, and a spacer layer 806 positioned between the reference layer 808 and the free layer 804, the spacer layer 806 providing a gap between the reference layer 808 and the free layer 804. The reference layer 808 extends beyond a rear extent of the free layer 804 in an element height direction perpendicular to a media-facing surface 816 of the device, and a rear portion (reacted spacer layer portion) 818 of the spacer layer 806 that extends beyond the rear extent of the free layer 804 has an increased resistivity in comparison with a resistivity of a rest of the spacer layer 806.

In one embodiment, as shown in FIGS. 7D and 8B, a thickness of the spacer layer 706, 806 is substantially constant along the element height direction (which is perpendicular to the plane of the media-facing surface 716, 816.

In another embodiment, as shown in FIG. 8A, the rear portion 818 of the spacer layer 806 comprises an oxide and/or a nitride that causes the rear portion 818 of the spacer layer 806 to exhibit electrically insulating properties.

The device may also include, in one approach, an AFM layer 810 positioned below the reference layer 808, and a refill material 814 positioned behind the rear extent of the free layer 804 in the element height direction and above the rear portion 818 of the spacer layer 806.

As shown in FIG. 8C, according to another embodiment, the device may include an insert layer 822 positioned below the spacer layer 806, the insert layer 822 comprising a reactive material that reacts in the presence of a reactive gas and/or plasma to form an electrically insulating material in a rear portion thereof (reacted insert layer portion) 824. At least some of the reactive material within the rear portion 824 of the insert layer 822 that extends beyond the rear extent of the free layer 806 has been reacted to form the electrically insulating material.

Furthermore, in some approaches, the rear portion 824 of the insert layer 822 may include an oxide and/or a nitride that causes the rear portion 824 of the insert layer 822 to exhibit increased resistivity in comparison to a resistivity of a rest of the insert layer 822.

In one approach, the spacer layer 806 may include a reactive material that reacts in the presence of a reactive gas and/or plasma to form an electrically insulating material, and at least some of the reactive material within the rear portion 818 of the spacer layer 806 has been reacted to form the electrically insulating material, as shown in FIG. 8B.

In one embodiment, a plurality of nanolayers of the reactive material may be positioned across the spacer layer 806 in a deposition thickness direction. In this or any other embodiment, more reactive material positioned closer to an upper surface of the spacer layer 806 may be reacted in comparison with reactive material positioned closer to a lower surface of the spacer layer 806.

In addition, the reactive material may comprise at least one of: Mg, Al, Si, and Sn, or any other suitable reactive materials known in the art.

In some approaches, a magnetic head using a sensor stack as described herein according to various embodiments may be used in a magnetic data storage system. The magnetic data storage system may be similar to that shown in FIG. 1. For example, the magnetic data storage system 100 may comprise at least one magnetic head 121 having a sensor stack as described according to any embodiment herein, a magnetic medium 112, a drive mechanism 118 for passing the magnetic medium 112 over the at least one magnetic head 121, and a controller 129 electrically coupled to the at least one magnetic head 121 for controlling operation of the at least one magnetic head 121.

Figure 9A:
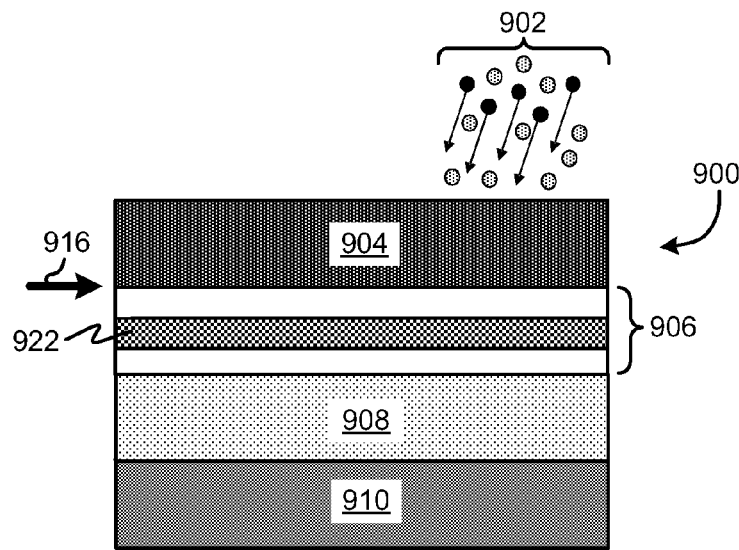
FIGS. 9A-9C show a series of steps in a formation process for a sensor stack according to one embodiment.
Figure 9B:
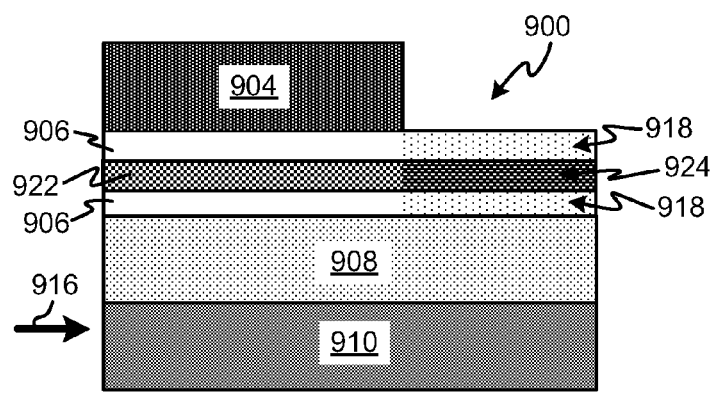
Figure 9C:
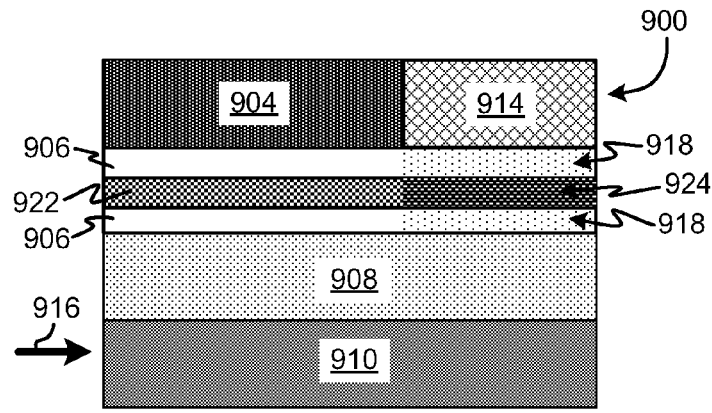

Now referring to FIGS. 9A-9C, an EPL process is shown according to another embodiment. In FIG. 9A, a stack 900 is shown prior to EPL processing which includes a free layer 904, a spacer layer 906 having one or more insert layers 922 therein, a reference (or pinned) layer 908, and an AFM layer 910. In one embodiment, a mask layer (not shown) may be formed above a portion of the free layer 904 to facilitate ion milling/oxidation 902 (or some other form of facilitating ion milling/oxidation 902 may be used as would be known by one of skill in the art). Then, ion milling/oxidation 902 is performed on the stack 900 in order to mill away and/or oxidize a back portion of the free layer 904 away from the media-facing surface 916 and maintain the spacer layer 906 without removing a substantial portion thereof.

In various embodiments, one, two, three, or more insert layers 922 may be positioned in a laminated spacer layer 906 structure.

In one embodiment, the ion milling/oxidation 902 may be performed in an environment having oxygen present, along with the ions used in the ion milling/oxidation 902. Because the ion milling/oxidation 902 is performed in an environment having a reactive gas therein (such as oxygen, nitrogen, etc.), as the back portion of the free layer 904 is milled away, the back portion of the spacer layer 906 beneath the back portion of the free layer 904 that is removed may react with the reactive gas which is deposited into the back portion of the spacer layer 906, thereby forming a reacted portion 918 of the spacer layer 906. Furthermore, a back portion of the insert layer 922 may react with the reactive gas which is deposited into the back portion of the insert layer 922, thereby forming a reacted portion 924 of the insert layer 922. When the reactive gas is oxygen, the reacted portion 918, 924 may be oxidized, when the reactive gas is nitrogen, the reacted portion 918, 924 may be nitrogenated, etc.

The reacted portion 918 of the spacer layer may have a substantially increased resistivity as compared to the rest (untreated portion) of the spacer layer 906. Therefore, it is much easier to maintain substantially all of the spacer layer 906 after the ion milling 902 is completed as compared to ion milling on an untreated spacer layer 906. Furthermore, the reacted portion 924 of the insert layer 922 may become insulating. This may occur due to Mg, Al, Si, and Sn, or any other suitable reactive material known in the art being in the insert layer 922 which reacts with the reactive gas to form an insulating material.

As shown in FIG. 9B, after the back portion of the free layer 904 is completely removed, most or all of the back portion of the spacer layer 906 may have reacted with the reactive gas as it is driven into the back portion of the spacer layer 906 to form the reacted portion 918, while most or all of the back portion of the insert layer(s) 922 may have reacted with the reactive gas as it is driven into the back portion of the insert layer(s) 922 to form the reacted portion(s) 924. These reacted portions 918, 924 may encompass an entire depth of the spacer layer 906 in the film deposition direction (perpendicular to the arrow indicating the media-facing surface 916), in one embodiment. In another embodiment, the reacted portions 918, 924 may encompass more than about 90%, 95%, 60%, 50%, 25%, etc. of the film thickness depth of the spacer layer 906 that is exposed at the back end of the spacer layer 906.

Then, in the void area left behind due to the ion milling/oxidation 902 as shown in FIG. 9C, an insulating refill material 914 is formed. Thereafter, the mask layer may be removed (possibly via planarization or some other method which may also planarize the upper surface of the refill material 914). This results in reacted portion(s) 918 which are harder to etch or ion mill than the spacer layer 906, and therefore more protection is afforded to the reference layer 908 during subsequent milling or etching processes. Furthermore, the reacted portion(s) 924 provide insulation to the reference layer 908 during subsequent milling or etching processes, further protecting this layer.

In one embodiment, the insert layer(s) 922 do not decrease the MR from the GMR device In one embodiment, the insert layer 922 may be positioned on or near a bottom of the spacer layer 906 to provide better magnetic behavior and no pinning loss. In any embodiment, the EPL process is improved by using this insert layer. Some possible insert layer 922 materials include, but are not limited to, Mg, Al, Ti, Si, Ge, W, V, Nb, Zr, Ga, Sn, Mo, and Cr.

Figure 14:
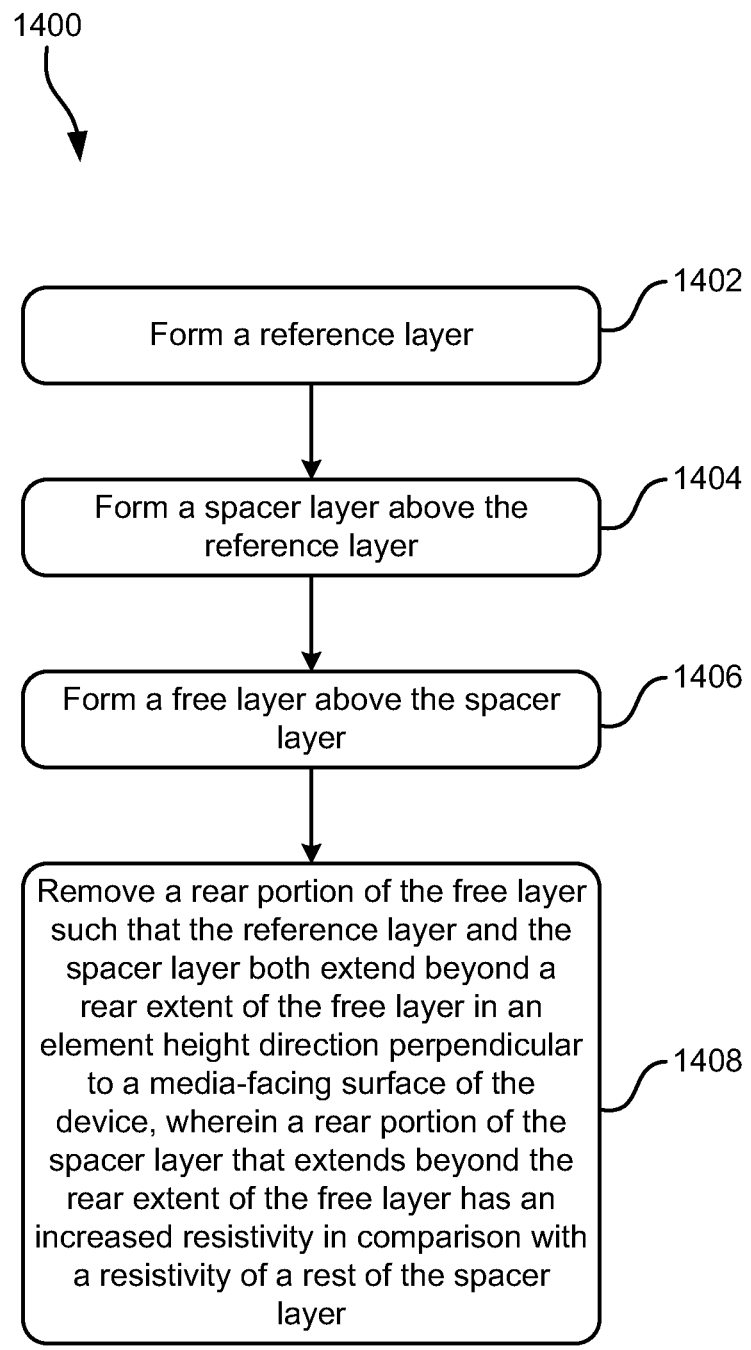
FIG. 14 shows a flowchart of a method according to one embodiment.

Now referring to FIG. 14, a method 1400 for forming a device (such as a sensor stack) is shown according to one embodiment. The method 1400 may be performed in accordance with the present invention in any of the environments depicted in FIGS. 1-8C, among others, in various embodiments. Of course, more or less operations than those specifically described in FIG. 14 may be included in method 1400, as would be understood by one of skill in the art upon reading the present descriptions.

Any formation technique may be used to form any of the layers, structures, films, and other components of method 1400 described herein, such as sputtering, plating, spin coating, chemical vapor deposition (CVD), atomic layer deposition (ALD), physical vapor deposition (PVD), etc.

Furthermore, any magnetic material may be used to form the magnetic layers described in method 1400, such as alloys of Co, Fe, Ni, and/or Pt, or any other suitable materials known in the art.

The method 1400 may begin with operation 1402, where a reference layer is formed, which may comprise a single pinned ferromagnet exchange coupled to an antiferromagnet, a pinned ferromagnet exchange coupled to an antiferromagnet and also coupled to a second reference ferromagnet layer through a thin coupling layer (such as Ru, Cr, etc.), or any other reference layer and/or pinned layer structure known in the art.

In operation 1404, a spacer layer is formed above the reference layer. The spacer layer may comprise any suitable material for reaction with a reactive material comprised therein, such as Ag, Cu, etc.

In operation 1406, a free layer is formed above the spacer layer. The free layer is configured to respond to external magnetic fields, thereby allowing the external magnetic field to be interpreted and, e.g., data to be read from a magnetic medium.

In operation 1408, a rear portion of the free layer is removed using any suitable technique known in the art. The removal of the rear portion of the free layer causes the reference layer and the spacer layer to both extend beyond a rear extent of the free layer in an element height direction perpendicular to the media-facing surface of the device.

Furthermore, a rear portion of the spacer layer that extends beyond the rear extent of the free layer has an increased resistivity in comparison with a resistivity of a rest of the spacer layer.

In a further embodiment, method 1400 may further include forming an AFM layer below the reference layer and forming a refill material above the rear portion of the spacer layer prior to removing the mask layer.

The removal of the rear portion of the free layer may be performed by forming a mask layer above a front portion of the free layer positioned adjacent the media-facing surface of the device prior to removing the rear portion of the free layer and removing the mask layer after removing the rear portion of the free layer, where ion milling is performed to remove the rear portion of the free layer.

In one embodiment, the ion milling does not substantially remove any material from the spacer layer such that a thickness of the spacer layer is substantially constant along the element height direction (e.g., less than about 5%, 3%, 1%, 0.5%, etc. of a thickness of the spacer layer is removed).

In another embodiment, the spacer layer may comprise a reactive material (such as Mg, Al, Ti, Si, Ge, W, V, Nb, Zr, Ga, Sn, Mo, Cr, etc.) that reacts in the presence of a reactive gas and/or plasma (such as oxygen, nitrogen, etc.) to form an electrically insulating material. In this embodiment, the reactive material within the rear portion of the spacer layer may be reacted to form an oxide and/or a nitride that causes the rear portion of the spacer layer to exhibit electrically insulating properties. This also slows the milling rate of the material, thereby allowing for more precise control of how much material is milled away.

In another approach, the oxide and/or nitride may be formed by performing the ion milling in an environment comprising Ar and oxygen and/or nitrogen, thereby allowing the oxide and/or nitrogen to be formed naturally as the material of the spacer layer is exposed to the environment. In this embodiment, the spacer layer may or may not include a reactive material besides the major material, e.g., Cu, Ag, etc.

In accordance with another approach, the oxide and/or nitride may be formed by exposing the rear portion of the spacer layer to an environment comprising oxygen and/or nitrogen. In this embodiment, the spacer layer may or may not include a reactive material besides the major material, e.g., Cu, Ag, etc.

According to one embodiment, method 1400 may further include forming an insert layer below the spacer layer, the insert layer comprising a reactive material that reacts in the presence of a reactive gas and/or plasma to form an electrically insulating material, and reacting at least some of the reactive material within a rear portion of the insert layer that extends beyond the rear extent of the free layer to form the electrically insulating material during the ion milling. The reactive material may be at least one of: Mg, Al, Ti, Si, Ge, W, V, Nb, Zr, Ga, Sn, Mo, Cr, etc.

In another embodiment, forming the spacer layer may comprise forming a plurality of nanolayers of the reactive material across the spacer layer in a deposition thickness direction.

Figure 15A:
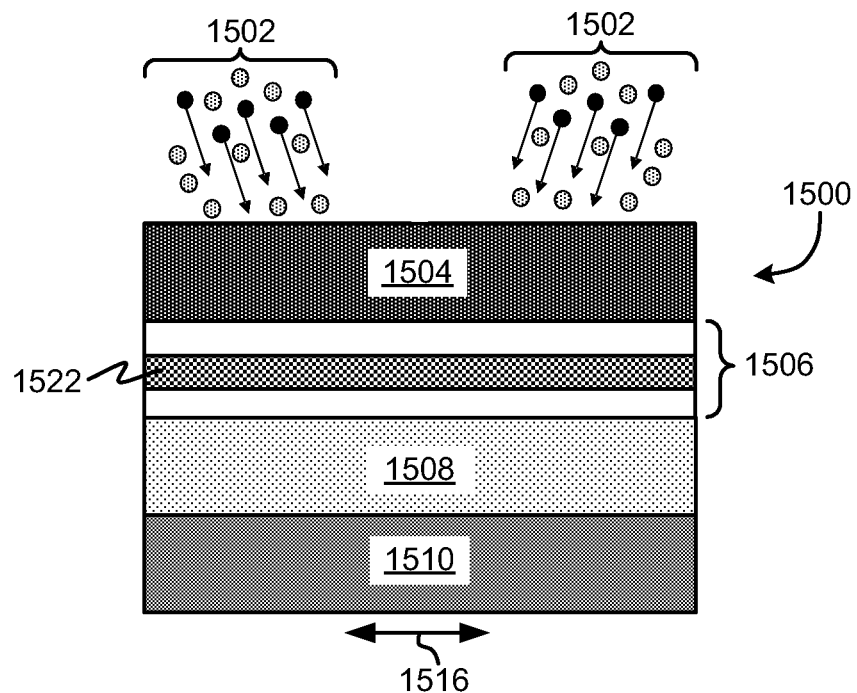
FIGS. 15A-15B show sensor stacks during a formation process according to one embodiment.
Figure 15B:
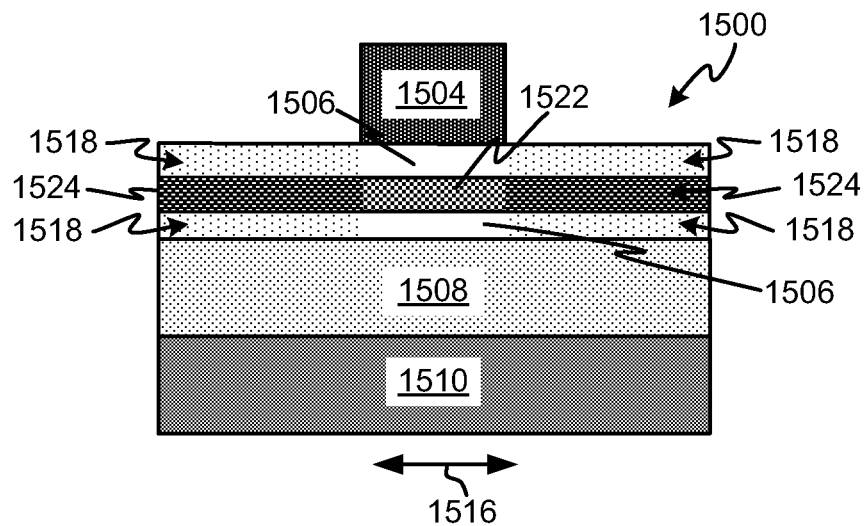

Now referring to FIGS. 15A-15B, which shows a stack 1500 from a media-facing surface thereof, according to one embodiment, the processing described previously may be extended in the cross-track direction 1516. As shown, the stack 1500 includes a free layer 1504, a spacer layer 1506 having one or more insert layers 1522 therein, a reference (or pinned) layer 1508, and an AFM layer 1510. In one embodiment, a mask layer (not shown) may be formed above a portion of the free layer 1504 to facilitate ion milling/oxidation 1502 (or some other form of facilitating ion milling/oxidation 1502 may be used as would be known by one of skill in the art). Then, ion milling/oxidation 1502 is performed on the stack 1500 in order to mill away and/or oxidize side portions of the free layer 1504 at the media-facing surface and maintain the spacer layer 1506 without removing a substantial portion thereof.

In various embodiments, one, two, three, or more insert layers 1522 may be positioned in a laminated spacer layer 1506 structure.

In one embodiment, the ion milling/oxidation 1502 may be performed in an environment having oxygen present, along with the ions used in the ion milling/oxidation 1502. Because the ion milling/oxidation 1502 is performed in an environment having a reactive gas therein (such as oxygen, nitrogen, etc.), as the side portions of the free layer 1504 are milled away, the side portions of the spacer layer 1506 beneath the side portions of the free layer 1504 that are removed may react with the reactive gas which is deposited into the side portions of the spacer layer 1506, thereby forming reacted portions 1518 of the spacer layer 1506 on both sides of the free layer 1504 in the cross-track direction 1516. Furthermore, side portions of the insert layer 1522 may react with the reactive gas which is deposited into the side portions of the insert layer 1522, thereby forming reacted portions 1524 of the insert layer 1522. When the reactive gas is oxygen, the reacted portions 1518, 1524 may be oxidized, when the reactive gas is nitrogen, the reacted portions 1518, 1524 may be nitrogenated, etc.

The reacted portions 1518 of the spacer layer may have a substantially increased resistivity as compared to the rest (untreated portion) of the spacer layer 1506. Therefore, it is much easier to maintain substantially all of the spacer layer 1506 after the ion milling 1502 is completed as compared to ion milling on an untreated spacer layer 1506. Furthermore, the reacted portions 1524 of the insert layer 1522 may become insulating. This may occur due to Mg, Al, Si, and Sn, or any other suitable reactive material known in the art being in the insert layer 1522 which reacts with the reactive gas to form an insulating material.

As shown in FIG. 15B, after the side portions of the free layer 1504 are completely removed, most or all of the side portions of the spacer layer 1506 may have reacted with the reactive gas as it is driven into the side portions of the spacer layer 1506 to form the reacted portions 1518, while most or all of the side portions of the insert layer(s) 1522 may have reacted with the reactive gas as it is driven into the side portions of the insert layer(s) 1522 to form the reacted portions 1524. These reacted portions 1518, 1524 may encompass an entire depth of the spacer layer 1506 in the film deposition direction (perpendicular to the arrow indicating the cross-track direction 1516), in one embodiment. In another embodiment, the reacted portions 1518, 1524 may encompass more than about 150%, 155%, 60%, 50%, 25%, etc. of the film thickness depth of the spacer layer 1506 that is exposed at the back end of the spacer layer 1506.

It should be noted that methodology presented herein for at least some of the various embodiments may be implemented, in whole or in part, in computer hardware, software, by hand, using specialty equipment, etc. and combinations thereof.

One advantageous aspect of the embodiments and approaches described herein is that the insert material does not decrease the GMR signal of the spin-valve in the unpatterned region. Insert material/Ag-alloy bi-layers and multi-layers have been described that do not cause the GMR to decrease when using inserts of acceptable materials.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A device, comprising:
a reference layer;
a free layer positioned above the reference layer; and
a spacer layer positioned between the reference layer and the free layer, the spacer layer providing a gap between the reference layer and the free layer,
wherein the reference layer extends beyond a rear extent of the free layer in an element height direction perpendicular to a media-facing surface of the device, and
wherein a rear portion of the spacer layer that extends beyond the rear extent of the free layer has an increased resistivity in comparison with a resistivity of a rest of the spacer layer.

2. The device as recited in claim 1, wherein a thickness of the spacer layer is substantially constant along the element height direction.

3. The device as recited in claim 1, wherein the rear portion of the spacer layer comprises an oxide and/or a nitride that causes the rear portion of the spacer layer to exhibit electrically insulating properties.

4. The device as recited in claim 1, further comprising:
an antiferromagnetic (AFM) layer positioned below the reference layer; and
a refill material positioned behind the rear extent of the free layer in the element height direction and above the rear portion of the spacer layer.

5. The device as recited in claim 1, further comprising an insert layer positioned below the spacer layer, the insert layer comprising a reactive material that reacts in the presence of a reactive gas and/or plasma to form an electrically insulating material, and wherein at least some of the reactive material within a rear portion of the insert layer that extends beyond the rear extent of the free layer has been reacted to form the electrically insulating material.

6. The device as recited in claim 5, wherein the rear portion of the insert layer comprises an oxide and/or a nitride that causes the rear portion of the insert layer to exhibit increased resistivity in comparison to a resistivity of a rest of the insert layer.

7. The device as recited in claim 5, wherein the reactive material comprises at least one of: Mg, Al, Ti, Si, Ge, W, V, Nb, Zr, Ga, Sn, Mo, and Cr.

8. The device as recited in claim 1, wherein the spacer layer comprises a reactive material that reacts in the presence of a reactive gas and/or plasma to form an electrically insulating material, and wherein at least some of the reactive material within the rear portion of the spacer layer has been reacted to form the electrically insulating material.

9. The device as recited in claim 8, wherein the reactive material comprises at least one of: Mg, Al, Ti, Si, Ge, W, V, Nb, Zr, Ga, Sn, Mo, and Cr, and wherein a plurality of nanolayers of the reactive material are positioned across the spacer layer in a deposition thickness direction, and wherein more reactive material positioned closer to an upper surface of the spacer layer is reacted in comparison with reactive material positioned closer to a lower surface of the spacer layer.

10. A magnetic data storage system, comprising:
at least one device as recited in claim 1;
a magnetic medium;
a drive mechanism for passing the magnetic medium over the at least one device; and
a controller electrically coupled to the at least one device for controlling operation of the at least one device.

11. A device, comprising:
a reference layer;
a free layer positioned above the reference layer; and
a spacer layer positioned between the reference layer and the free layer, the spacer layer providing a gap between the reference layer and the free layer,
wherein the reference layer extends beyond a rear extent of the free layer in an element height direction perpendicular to a media-facing surface of the device, and
wherein side portions of the spacer layer that extend beyond sides of the free layer in a cross-track direction have an increased resistivity in comparison with a resistivity of a rest of the spacer layer.

12. A method for forming a device, the method comprising:
forming a reference layer;
forming a spacer layer above the reference layer;
forming a free layer above the spacer layer; and
removing a rear portion of the free layer such that the reference layer and the spacer layer both extend beyond a rear extent of the free layer in an element height direction perpendicular to a media-facing surface of the device,
wherein a rear portion of the spacer layer that extends beyond the rear extent of the free layer has an increased resistivity in comparison with a resistivity of a rest of the spacer layer.

13. The method as recited in claim 12, further comprising:
forming an antiferromagnetic (AFM) layer below the reference layer; and
forming a refill material above the rear portion of the spacer layer.

14. The method as recited in claim 12, further comprising:
forming a mask layer above a front portion of the free layer positioned adjacent the media-facing surface of the device prior to removing the rear portion of the free layer; and
removing the mask layer after removing the rear portion of the free layer,
wherein ion milling is performed to remove the rear portion of the free layer.

15. The method as recited in claim 14, wherein the ion milling does not substantially remove any material from the spacer layer such that a thickness of the spacer layer is substantially constant along the element height direction.

16. The method as recited in claim 12, wherein the spacer layer comprises a reactive material that reacts in the presence of a reactive gas and/or plasma to form an electrically insulating material, and further comprising reacting the reactive material within the rear portion of the spacer layer to form an oxide and/or a nitride that causes the rear portion of the spacer layer to exhibit electrically insulating properties.

17. The method as recited in claim 16, wherein the oxide and/or nitride is formed by performing ion milling in an environment comprising Ar and oxygen and/or nitrogen.

18. The method as recited in claim 16, wherein the oxide and/or nitride is formed by exposing the rear portion of the spacer layer to an environment comprising oxygen and/or nitrogen.

19. The method as recited in claim 12, further comprising:
forming an insert layer below the spacer layer, the insert layer comprising a reactive material that reacts in the presence of a reactive gas and/or plasma to form an electrically insulating material; and
reacting at least some of the reactive material within a rear portion of the insert layer that extends beyond the rear extent of the free layer to form the electrically insulating material during the ion milling,
wherein the reactive material comprises at least one of: Mg, Al, Ti, Si, Ge, W, V, Nb, Zr, Ga, Sn, Mo, and Cr.

20. The method as recited in claim 12, wherein forming the spacer layer comprises forming a plurality of nanolayers of a reactive material across the spacer layer in a deposition thickness direction, wherein the reactive material comprises at least one of: Mg, Al, Ti, Si, Ge, W, V, Nb, Zr, Ga, Sn, Mo, and Cr.

* * * * *